US009275708B2

(12) United States Patent
Fontana et al.

(10) Patent No.: US 9,275,708 B2
(45) Date of Patent: Mar. 1, 2016

(54) ROW ADDRESS DECODING BLOCK FOR NON-VOLATILE MEMORIES AND METHODS FOR DECODING PRE-DECODED ADDRESS INFORMATION

(71) Applicant: Micron Technology, Inc., Boise (ID)

(72) Inventors: Marco Giovanni Fontana, Milan (IT); Giuseppe Sciascia, Ramacca (IT); Giovanni Bolognini, Paderno d'Adda (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/180,060

(22) Filed: Feb. 13, 2014

(65) Prior Publication Data

US 2014/0160875 A1  Jun. 12, 2014

Related U.S. Application Data

(63) Continuation of application No. 13/071,296, filed on Mar. 24, 2011, now Pat. No. 8,681,572.

(51) Int. Cl.
*G11C 8/10* (2006.01)
*G11C 16/08* (2006.01)

(52) U.S. Cl.
CPC . *G11C 8/10* (2013.01); *G11C 16/08* (2013.01)

(58) Field of Classification Search
CPC .................................. G11C 8/08; G11C 8/10
USPC ..................................................... 365/230.06
See application file for complete search history.

(56) References Cited

U.S. PATENT DOCUMENTS

| 6,233,198 | B1 | 5/2001 | Choi |
| 7,023,738 | B2 * | 4/2006 | Vimercati et al. ....... 365/185.23 |
| 7,161,842 | B2 | 1/2007 | Park |
| 7,333,366 | B2 | 2/2008 | Abedifard |
| 7,548,463 | B2 | 6/2009 | Watanabe et al. |
| 7,613,042 | B2 | 11/2009 | Zhang et al. |
| 7,821,832 | B2 | 10/2010 | Hahn |
| 8,289,775 | B2 * | 10/2012 | Lee et al. ................. 365/185.18 |
| 2002/0186590 | A1 | 12/2002 | Lee |
| 2007/0195605 | A1 | 8/2007 | Garofalo et al. |
| 2009/0185422 | A1 | 7/2009 | Kang et al. |
| 2009/0310409 | A1 | 12/2009 | Ajika et al. |
| 2012/0243344 | A1 | 9/2012 | Fontana et al. |

FOREIGN PATENT DOCUMENTS

KR  20090080337  7/2009

OTHER PUBLICATIONS

Zhi-Gang, Duan et al., "A Compact Flash Memory for Embedded System Applications", Institute of Micro Electronics (IEEE, 2003), Tsinghua University, Beijing, China.

* cited by examiner

*Primary Examiner* — Hoai V Ho
*Assistant Examiner* — Tri Hoang
(74) *Attorney, Agent, or Firm* — Dorsey & Whitney LLP

(57) ABSTRACT

Decoding blocks, memories, and methods for decoding pre-decoded address information are disclosed. One such decoding block includes a first latch and voltage shift circuit configured to receive first pre-decoded address information at first voltage levels and further configured to latch the first pre-decoded address information and shift the voltage levels of the same to second voltage levels. An address decoder includes a second latch and voltage shift circuit configured to receive second pre-decoded address information at the first voltage levels and latch and shift the voltage levels of the same to the second voltage levels. The address decoder is further configured to select control gates of the memory cells of the memory based at least in part on the first and second pre-decoded address information.

20 Claims, 6 Drawing Sheets

ROW ADDRESS DECODING BLOCK FOR NON-VOLATILE MEMORIES AND METHODS FOR DECODING PRE-DECODED ADDRESS INFORMATION

CROSS-REFERENCE TO RELATED APPLICATION

This application is a continuation of U.S. patent application Ser. No. 13/071,296, filed Mar. 24, 2011 and issued as U.S. Pat. No. 8,681,572 on Mar. 25, 2014. This application and patent are incorporated by reference herein in their entirety and for all purposes.

TECHNICAL FIELD

Embodiments of the present invention relate generally to non-volatile memory, and more specifically in one or more of the illustrated embodiments, to address decoding blocks for decoding address information for a non-volatile memory having sectors of memory.

BACKGROUND OF THE INVENTION

Data in electronic circuits may be stored in memory, for example, semiconductor memory. Examples of memory include volatile memory, which is limited to storing data while power is provided to the memory, and non-volatile memory, which can store data even when power is no longer provided to the memory.

Non-volatile memory typically have memory operations, for example, read, write, and erase. Data is retrieved from the memory by "reading" the data while data is stored to the memory by "writing" the data. Memory addresses are provided to the memory and decoded by internal, address decoders included m the memory to identify the particular memory to be read or written. Erase operations are used to clear data from memory, given that data may be stored indefinitely until "erased." Non-volatile memories may be structured to have erase operations occur at various levels of memory. For example, the memory area in which data is stored may be segmented into sections of memory and data for an entire section of memory may be erased during erase operations. Additionally, in some memories the sections of memory may be further segmented into memory sub-sections so that data, am be erased at level of memory sub-sections rather, mast entire sections of memory. The design of the memory area may be influenced by whether per section or per sub-section erase operations may be performed.

Non-volatile memories have become more popular as mobile and compact electronic devices, for example, mobile phones, digital cameras, portable computers, and other such devices, require storage of information even after the electronic device is switched off. Generally, it is desirable to design non-volatile memories to have compact circuitry, which can be advantageously used to design memories of greater capacity for a given space, or to make the memory smaller to allow for an electronic device including memory to have a smaller form factor. It is also generally desirable to design the memory circuitry to be efficient and use less power so that less battery power may be used daring operation.

Therefore, alternative memory circuit designs that may provide greater circuit density, smaller size, and/or lower power consumption is desirable.

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control, signals, timing protocols, and software operations have not been shown in detail in order to avoid unnecessarily obscuring the invention.

Figure 1:
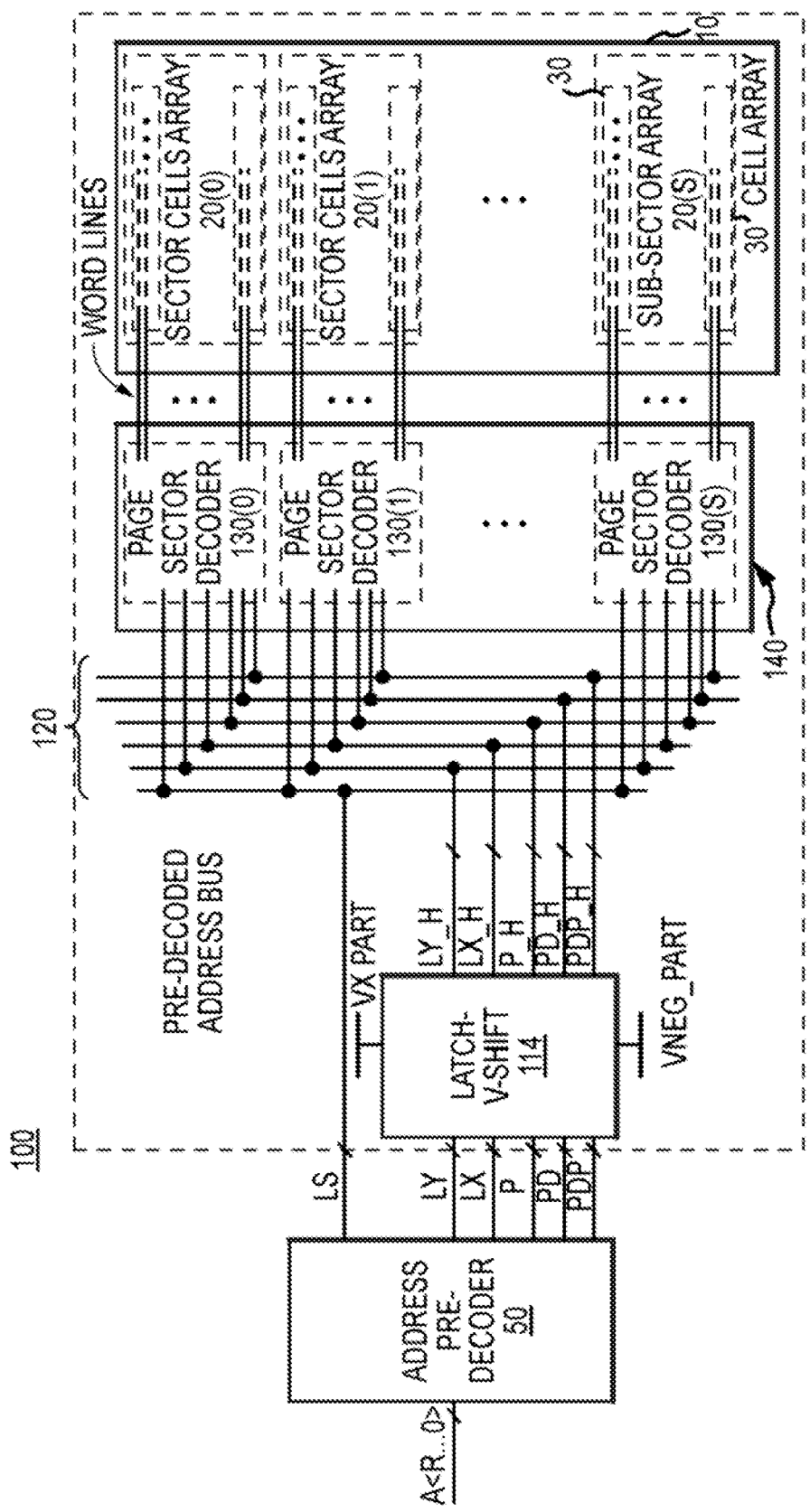
FIG. 1 is a block diagram of a decoding block according to an embodiment of the invention.

FIG. 1 illustrates a decoding block 100 according to an embodiment of the invention. The decoding block 100 may be included in a non-volatile memory, for example, a NOR Flash memory. The decoding block 100 may be associated with a partition of memory, for example, a bank or block of memory, having a cell array 10 that may be logically divided into sectors of memory 20. The sectors of memory 20 may be further divided into memory sub-sectors 30. An address pre-decoder circuit 50 configured to receive address information <R . . . 0> from an address bus pre-decodes the address information into pre-decoded address information, for example, sector information LS and page-row information including LX, LY, P, PDS and POP. Each of the LS, LX, LY, P, PD, and PDF information includes a combination of bits (i.e., binary digits).

The decoding block 100 includes a latch and voltage shift circuit 114 configured to receive the LX, LY, P, PD, and PDP information from the address pre-decoder circuit 50. The latch and voltage shift circuit 114 is configured to latch the information provided from the address pre-decoder 50 and shift the voltage levels of the LX, LY, P, PD, and PDP information to provide LX_H, LY_H, P_H, PD_H, and PDP_H information having different voltage levels. For example, the LX, LY, P, PD, and PDP information may have relatively low voltage levels (e.g., between the range of 0 and 4 volts). In some embodiments, the latch and voltage shift circuit 114 is further receives the LS information and is configured to latch the information and shift the voltage levels of the LS information to provide LS_H information having a different voltage.

The latch and voltage shift circuit 114 may provide LX_H, LY_H, P_H, PD_H, and PDP_H information that may have relatively high voltage levels (e.g., between the range of −10 and +10 volts). The latch and voltage shift circuit 114 may include an array of latch and shift circuits for latching and shitting the voltage levels of the pre-decoded address information. The latch and shift circuit 114 is provided a logic level voltage VX_PART and a logic level voltage VNEG_PART that provides the voltage levels for the logic levels of the voltage shifted pre-decoded address information. For example, the VX_PART logic level voltage may be used for pre-decoded address information having a "1" logic level provided by the latch and shift circuit 114 and the VNEG_PART logic level voltage may be used for pre-decoded address information having a "0" logic level.

The LS, LX_H, LY_H, P_H, PD_H, and PDP_H information are provided over a pre-decoded address bus 120 to an address decoder 140. Although not shown in FIG. 1, in embodiments where LS_H is provided by the latch and voltage shift circuit 114, the LS_H information may be provided over the address bus 120. The address decoder includes page-sector decoders 130(0)-130(S), each of which is coupled to control gates of the memory cells (e.g., by way of word lines coupled to the control gates of the memory cells) of a respective memory sector 20(0)-20(S). A memory array 10 includes memory cells having control gates, and may be divided into memory sectors 20. The control gates of the memory cells may be coupled to word lines. The memory sectors 20 may be divided into sub-sectors 30, for example, pages of memory. The page-sector decoders 130(0)-130(N) may be used to select the different sub-sectors for operation, such as an erase operation where all of the memory cells of a sub-sector are erased while the memory cells of the other sub-sectors of a memory sector continue to store data. The individual sub-sectors 30 may be selected for other memory operations as well. In operation, the address decoding block 100 decodes the address information provided to the address pre-decoder circuit 50 to select memory cell(s) (e.g., a row or rows of memory cells) corresponding to the address information. As previously mentioned, the sub-sectors may be selected by the page-section decoders 130(0)-130(N) for various memory operations as well.

In some embodiments, the decoding block 100 may provide a benefit of reducing the number of voltage shift circuits needed for proper operation of a memory, as well as providing a delineation between relatively low-voltage circuitry and relatively high-voltage circuitry. Additionally, the sectors of memory 30 of the array 10 may be formed without sector-to-sector p-well separation.

Figure 2:
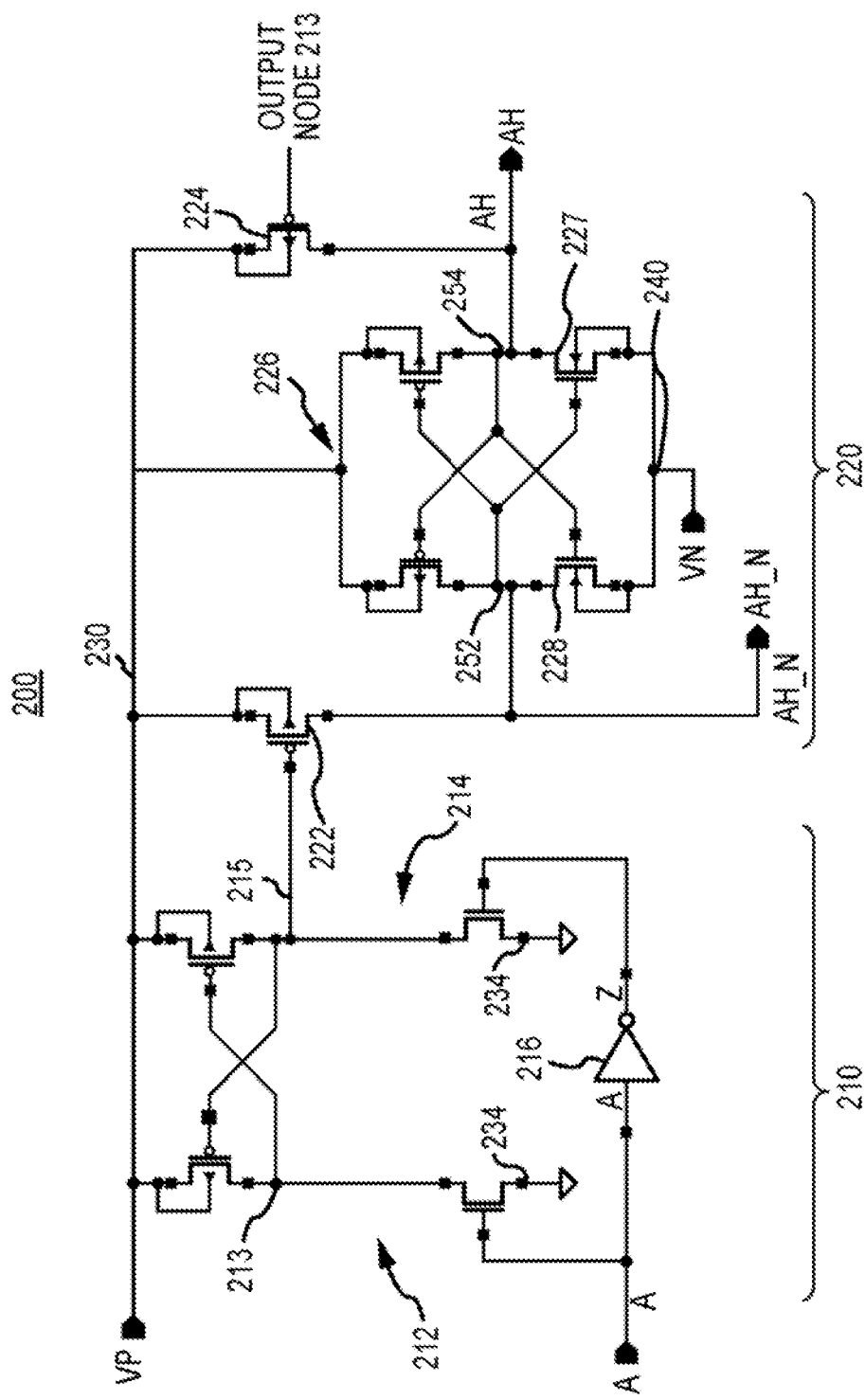
FIG. 2 is a schematic diagram of a latch and voltage shift circuit according to an embodiment of the invention.

FIG. 2 illustrates a latch and voltage shift circuit 200 according to an embodiment of the invention. The latch and voltage shift circuit 200 may be used for the latch and voltage shift circuit 114 of the embodiment of FIG. 1. The latch and voltage shift circuit 200 is configured to latch the logic levels of an input signal provided to an input A and shift the voltages of "0" and "1" logic levels to different voltages, for example, VN and VP voltages, respectively. The voltage shift circuit 200 outputs from an output AH a "0" logic level having the VN voltage and a "1" logic level having the VP voltage. An output AH_N provides the complementary logic level of the AH output. The VN and VP voltages may be, for example, supply voltages that may change according to an operation of the memory, as will, be explained in more detail below. In some embodiments, the latch and voltage shift circuit 200 includes circuitry configured to handle relatively high positive voltages for the VP voltage and relatively high negative voltages for the VN voltage. For example, the dimensions of the transistors, oxide thicknesses, transistor characteristics, among other things, may be selected to accommodate operation with relatively high voltages.

The latch and voltage shift circuit 200 includes first and second stages 210, 220, The first stage 210 is configured to shift the voltages of "0" and "1" logic levels of the input signal provided to the A input to a reference potential and VP. An example of a reference potential is ground, however, other reference potentials may be used as well. The second stage 220 is configured to shift the ground and VP voltages of the first stage 210 to VN and VP voltages for "0" and logic levels output at AH and AH_N. The voltages of the logic levels for the input signal at the A input may be relatively low voltages and the latch and voltage shift circuit 200 is used to shift the "0" and "1" logic levels to relatively high voltages. That is, the voltage shift circuit 200 shifts a relatively low voltage input signal to a relatively high voltage output signal. In some embodiments, the voltages may vary in the range of −10 and +10 volts, which may be used, for example, daring programming or erasing memory. It will be appreciated, however, the voltage applied to the circuitry should be within the acceptable range of operation, for example, a maximum value VP-VN of 12 volts.

The first stage 210 includes complementary-FET (i.e., field effect transistors) inverters 212 and 214, and further includes inverter 216. The inverters 212, 214 have respective output nodes 213, 215 and are coupled between a VP voltage node 230 and ground 234. The gates of the NFETs (n-channel FETs) are coupled to receive the input signal from the A input and a complement of the input signal provided by the inverter 216. The gates of the PFETs (p-channel FETs) are coupled to the output nodes 213, 215 of the other inverter. In operation, the first stage 210 latches an input signal by coupling art output node 213 to the VP voltage node 230 in response to a "0" logic level input signal and couples the output node 213 to ground 234 responsive to a "1" logic level input signal.

The second stage 220 is coupled to the output nodes 213 and 215. The second stage 220 includes a latch 226 formed, for example, from cross-coupled complementary FET inverters. The latch 226 is coupled between the VP voltage node 230 and a VN voltage node 240. Transistors 222 and 224 are coupled between the VP voltage node 230 and input/output nodes 252 and 254, respectively. The transistor 222 is coupled to the output node 215 and the transistor 224 is coupled to the output node 213. In operation, the latch and voltage shift circuit 200 may be operated in two phases, that is, for example, a data load phase and a data latch phase, as will be described in more detail below.

In the data load operation, responsive to the output node 215 being coupled to ground the transistor 222 is more conductive than transistor 228. As a result, the input/output node 252 is pulled to a higher voltage than the input/output node 254. The latch 226 latches the logic levels by coupling the node 252 to the VP voltage node 230 and coupling the node 254 to the VN voltage node 240 through the transistors of the complementary FET inverters. Operation is similar in the case where the output node 213 is coupled to ground instead of the output node 215.

Data loading is inhibited when the VP voltage is lower than the absolute value of a negative VN voltage, which results in the conductivity of transistors 222 and 224 unable to overcome the conductivity of transistors 227 and 228. This leads to a data latch condition, which may be achieved by grounding the VP voltage during the data latch phase. That is, the latch 226 latches the output of the first stage 210 responsive to the VP voltage being insufficient to overcome the drive of the VN voltage. In summary, a "0" logic level input signal at the A input results in a "0" logic level at the AH output (i.e., input/output node 254) having a VN voltage and a "1" logic level having a VP voltage at the AH_N output (i.e., input/output node 252). A "1" logic level at the A input signal results in "1" at the AH output having a VP voltage and a "0" logic level having a VN voltage at the AH_N output.

Figure 3:
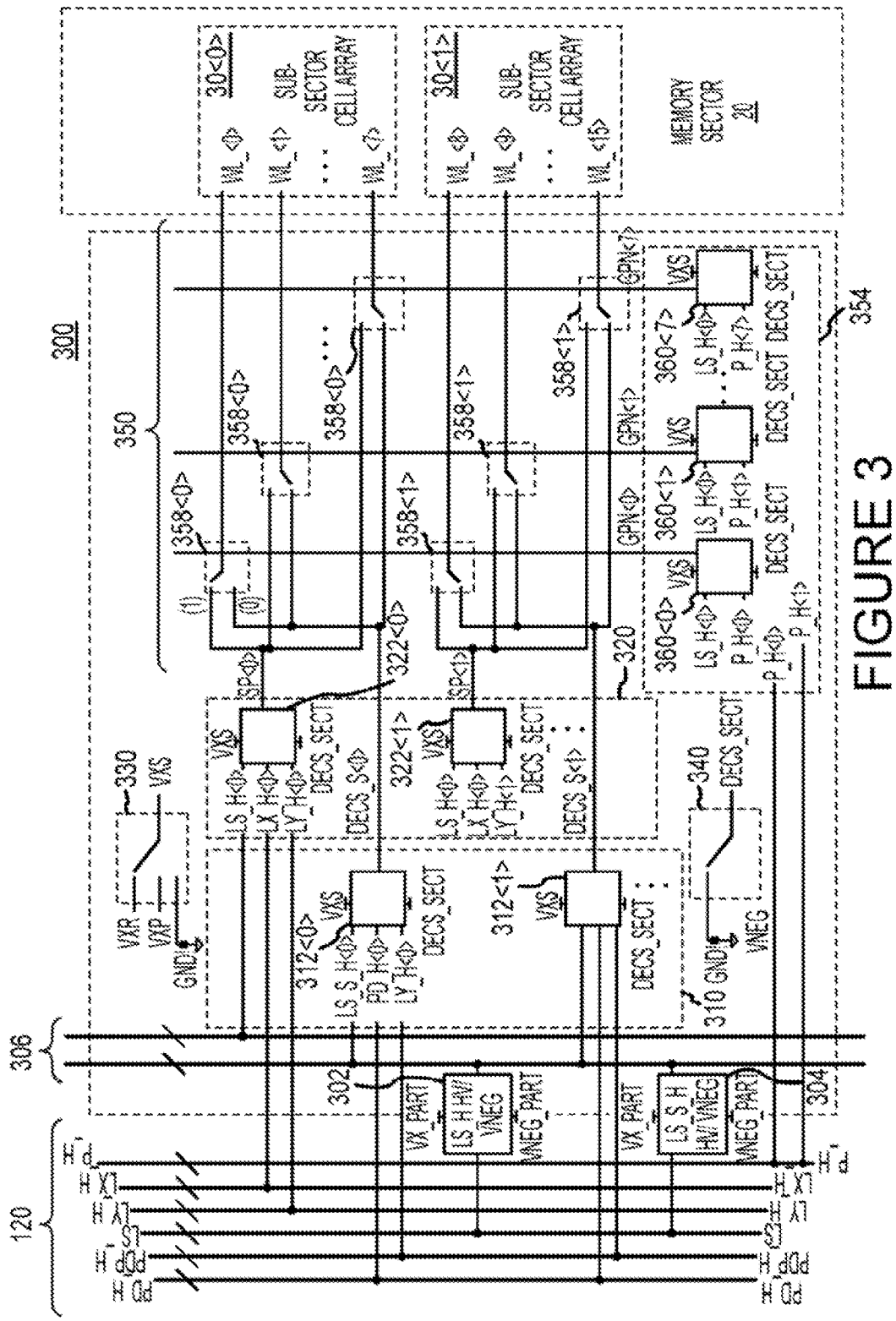
FIG. 3 is a block diagram of a page-sector row selector according to an embodiment of the invention.

FIG. 3 illustrates a page-sector row selector 300 according to an embodiment of the invention. The row selector 300 may be included in a page-sector decoder, for example, page-sector decoders 130 of FIG. 1. The row selector 300 may be used to select the rows of memory based at least in part on pre-decoded address information for memory operations, Additionally, the row selector 300 may also be used to select a sub-sector 30 of memory based at least in part on the pre-decoded address information for memory operations.

Decode logic 310 and 320 are configured to receive pre-decoded address information from the pre-decoded address bus 120. For example, as shown in the embodiment of FIG. 3, the decode logic 310 receives the PD_H, and PDP_H pre-decoded address information and the decode logic 320 receives the LX_H and LY_H pre-decoded address information from, the pre-decoded address bus 120. As previously discussed, the LX_H, LY_H, PD_H, and PDP_H pre-decoded address information are at voltage levels set by a latch and voltage shift circuit, for example, latch and voltage shift circuit 114 of FIG. 1.

The LS pre-decoded address information, as also previously discussed, may be provided to the tow selector 300 at a relatively low voltage over the pre-decoded address has 120. A latch, and voltage shift circuit 302 is configured to shift the LS pre-decoded address information to different voltage levels to provide LS_H pre-decoded address information for use in the row selector 300. Logic-latch and voltage shift circuit 304 is configured to provide LS_S_H pre-decoded address information based at least in part on the LS pre-decoded address information and having voltage levels set by the logic-latch and voltage shift circuit 304 for use in the row selector 300. The latch and shift voltage shift circuit 302 and the logic-latch and voltage shift circuit 304 are used to provide the LS_H and LS_S_H pre-decoded address information locally, that is, at the level of the page-sector row selector. In contrast other pre-decoded address information, for example, LX_H, LY_H, PD_H and PDP_H having the voltage shifted voltage levels are provided to the row selector 300. The LS_H pre-decoded address information, is provided to the decode logic 320 and the LS_S_H pre-decoded address information is provided to the decode logic 310. In some embodiments, however, LS_H is not generated locally and may be provided to the tow selector 300 by the pre-decoded address bus 120.

The decode logic 310 include logic circuits 312<0>-312<M>. Only logic circuits 312<0> and 312<1> are illustrated in FIG. 3, but those ordinarily skilled in the art will appreciate that the decode logic 312 may include greater or fewer logic circuits 312. The logic circuits 312 provide decode selection, signals DECS_S<0>-DECS_S<M> having a logic level based at least in part on the combination of bits received by the respective logic circuits 312. In some embodiments, the logic circuits 312 may be configured to provide NAND logic operations. For example, the logic circuit 312<0> of FIG. 3 provides a logic "0" DECS_S<0> decode selection signal responsive to LS_S_H-<0>, PD_H<0>, and PDP_H<0> pre-decoded address information ail having a "1" logic level. The logic circuit 312<0> provides a logic "1" DECS_S<0> decode selection signal for all other combinations of logic levels of the LS_S_H<0>, PD_H<0>, and PDP_H<0> pre-decoded address information.

The decode logic 320 include logic circuits 322<0>-322<M> Only logic circuits 322<0> and 322<1> are illustrated in FIG. 3, but those ordinarily skilled in the art will appreciate that the decode logic 320 may include greater or fewer logic circuits 322. The logic circuits 322 provide decode selection signals SP<0>-SP<M> having a logic level based at least in part on the combination of bits received by the respective logic circuit 322, in some embodiments, the logic circuits 322 may be configured to provide AND logic operations. For example, the logic circuit 322<0> of FIG. 3 provides a logic "1" SP<0> decode selection signal responsive to LS_H<0>, LX_H<0>, and LY_H<0> pre-decoded address information all having a "1" logic level. The logic circuit 322<0> provides a logic "0" SP<0> decode selection signal for all other combinations of logic levels of the LS_H<0>, LX_H<0>, and LY_H<0> pre-decoded address information.

As will be described in more detail below, logic circuits 312 and 322 are coupled to supply voltages VXS and DECS_SECT. The VXS voltage is output by die logic circuits 312, 322 for a "1" logic level and the DECS_SECT voltage is output for a "0" logic level. The VXS voltage is provided through a voltage selection switch 330 configured to switch the VXS voltage between various voltages and the DECS_SECT voltage is provided through a voltage selection switch 340 configured to switch the DECS_SECT voltage between various voltages. For example, as illustrated in FIG. 3, the VXS voltage may be switched between a read voltage VXR, a program voltage VXP, and a reference potential, for example, ground. The DECS_SECT voltage may be switched between ground and a negative voltage VNEG, In some embodiments, the VXR voltage may be approximately 5 Volts, the VXP voltage may be approximately 10 Volts and the VNEG voltage may be approximately −10 Volts. The VXR, VXP, and VNEG voltages may vary based on operation of the memory as well, that is, for example, the VXP voltage may vary over the range of 1 to 10 Volts and the VNEG voltage may change over the range of −3 to −10 Volts. Other voltage magnitudes may be used for VXR, VXP, and VNEG as well.

The DECS_S<0>-DECS_S<M> and SP<0>-SP<M> decode selection signals are provided to multiplexer 350. The multiplexer 350 includes switches 358 that are coupled to the decode selection signals provided by the decode logic 310, 320. The switches 358 are further coupled to word lines WL (corresponding to rows of memory; the word lines coupled to control gates of memory cells) of the memory sector 20. The switches 358 are configured to couple the respective WL to the SP or DECS_S decode selection signal responsive to a respective switch control signal. As illustrated in FIG. 3, a set of switches 358 are coupled to respective SP and DECS_S decode selection signals to select rows of memory corresponding to a sub-sector 30 of memory. For example, switches 358<0> receive the decode selection signals SP<0> and DECS_S<0> and switches 358<1> receive the decode selection signals SP<1> and DECS_S<1>. Multiplexer control logic 354 provides switch control signals to control the switches 358. Logic circuits 360 included in the multiplexer control logic 354 provide switch control signals GPN<0>-GPN<S> to control switches 358 responsive to pre-decoded address information. LS_H and P_H. In some embodiments, the logic circuits 360 may be configured to provide AND logic operations. The logic circuit 360 are coupled to supply voltages VXS and DECS_SECT to output the VXS voltage for a "1" logic level and output the DECS_SECT voltage for a "0" logic level.

The combination of logic levels of the LS_H and P_H information determines which switches 358 are controlled to couple the respective word, line WL to the SP decode selection signal and which are controlled to couple the respective word line WL to the DECS_S decode selection signal. For example, the switches 358<0> and 358<1> coupled to logic circuit 360<0> are controlled to couple the word lines WL to SP<0> and SP<1>, all respectively, responsive to the LS_H<0> and P_H<0> pre-decoded address information both having a "1" logic level. In this condition, the logic circuit 360<0> provides a "1" logic level GPN<0> signal. Note, however, that the logic levels of the decode selection signals SP<0> and SP<1> may be different due to the combination of logic levels of the pre-decoded address information LX_H and LY_H. For example, the SP<0> signal may be at a "1" logic level while the SP<1> signal may be at a "0"

logic level. As a result, although the switch 358<1> coupled to the logic circuit 360<0> couples the respective word line to SP<1>, the word line remains deselected.

Operation of the page-sector row selector 300 will be described for an erase operation according to an embodiment of the invention, for a selected sub-sector of memory. In operation, the page-sector row selector 300 receives the sector information LS and page-row information LX, LY, P, PD, and PDP from the address pre-decoder circuit 50. The voltage levels of the page-row information may be shifted to the voltage levels that will be used by the page-sector row selector 300 during the erase operation by the latch and voltage shift circuit 114 (FIG. 1), for example, and provided over the pre-decoded address bus 120.

Figure 4:
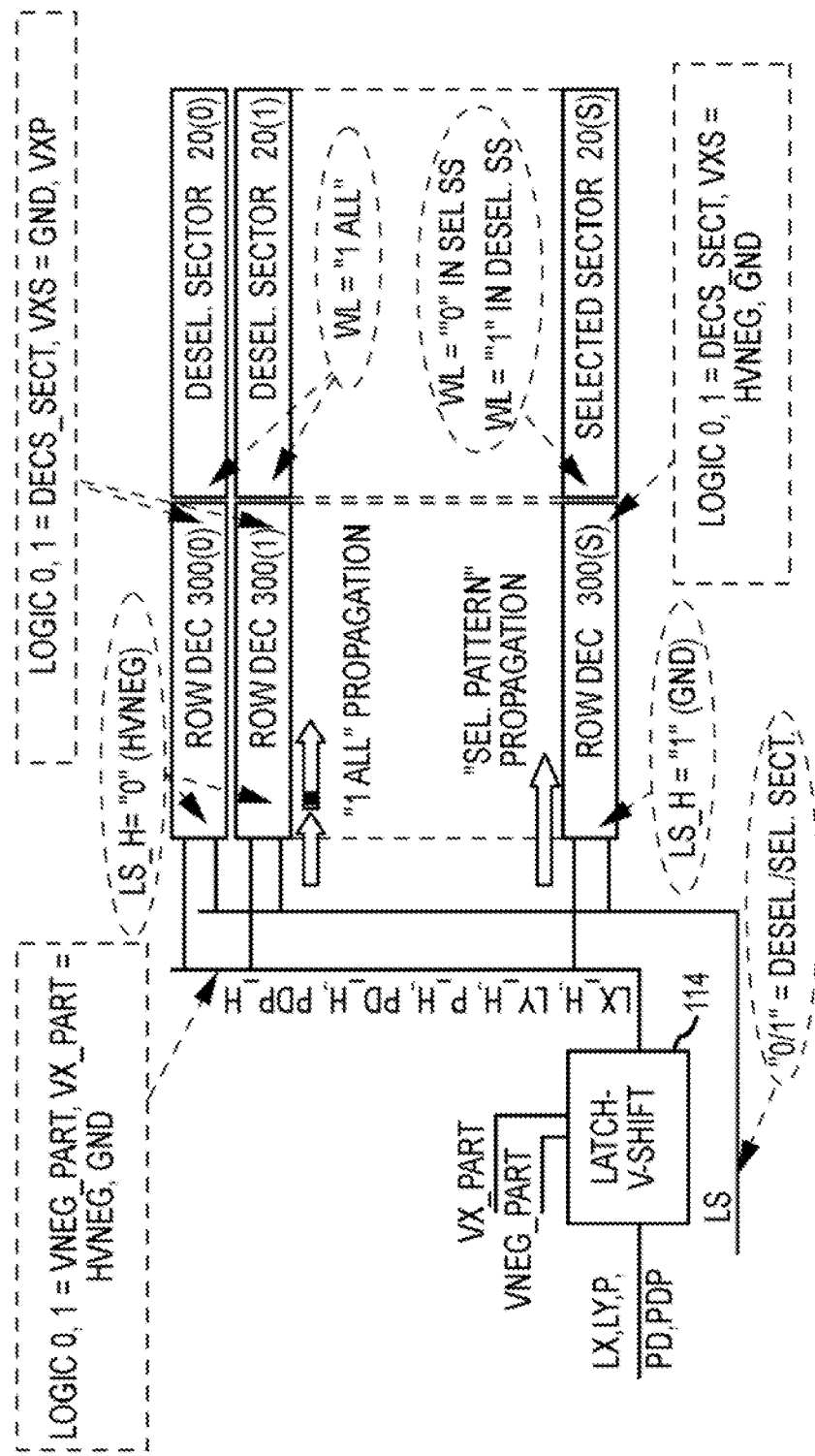
FIG. 4 is a block diagram of a page-sector row selector and operation according to art embodiment of the invention.

The latch and voltage shift circuit 114 is also illustrated in FIG. 4 as providing the page-row information LX_H, LY_H, P_H, PD_H, and PDP_H with the shifted voltage levels. The sector information LS, as previously discussed, may be provided to the page-sector row selector 300 having voltage levels that are different than those used by the page-sector row selector 300 during the erase operation. A local latch and voltage shift circuit, for example, latch and voltage shift circuit 302 of FIG. 3, shifts the voltage levels to provide voltage shifted LS_H information having the voltage levels to be used in the page-sector row selectors 300. A local logic-latch and voltage shift circuit, for example, logic-latch and voltage shift circuit 300, 304 provides voltage shifted LS_S_H information having the voltage levels used in the page-sector row selectors 300. In some embodiments, as also previously discussed, LS_H information is provided to the page-sector row selector 300 rather than being provided locally by the latch and voltage shift circuit 302.

As further shown in FIG. 4, the logic levels for the page-row information for selecting a sub-sector of memory cells of an erase operation are LX and LY (and LX_H and LY_H) are at a logic "1." As will be described in more detail below, the memory sector 20 having the sub-sector to be erased is selected based on the LS information, and the particular sub-sector to be erased is selected by the PD and PDF information. The P information may be used to select the individual word fines WL (or all WLs of a selected sub-sector of memory) to be erased. For unselected memory sectors 20 the LS (and LS_H) information is at a "0" logic level whereas for memory sector 20 having the selected sub-sectors of memory the LS (and LS_H) information is at a "1" logic level. As illustrated in FIG. 4, the voltage levels for the voltage shifted page-row information LX_H, LY_H, P_H, and PDP_H are set by VNEG_PART and VX_PART, for example, a logic "0" has a VNEG_PART voltage and a logic "1" has a VX_PART voltage. The voltage levels of the voltage shifted sector information LS_H is also set by VNEG_PART and VX_PART. In carrying out an erase operation the VNEG_PART voltage is HVNEG (e.g., a relatively high negative voltage) and the VX_PART voltage is at a reference potential, ground GND. That is, a logic "0" is VNEG For the unselected memory sectors 20, both LS_H and LS_S_H are at logic level "0" with reference to the logic circuits 312 and 322 of the decode logic 310, 320 (FIG. 3), the decode selection signals DECS_S are at a logic "1" and SP are at a logic "0." Moreover, the switches 358 are controlled by the multiplexer control logic 354 to couple the respective word lines WL of the unselected memory sectors to DECS_S. As previously discussed, the output voltage levels of the logic circuits 312, 322 is set to VXS for a logic "1" and set to DECS_SECT for a logic "0." During an erase operation, the VXS voltage is VXP and the DECS_SECT voltage is GND. As a result, the word lines WL of the unselected memory sectors 20 are coupled to VXP (i.e., WL coupled to DECS_S, which is at logic "1" represented by a VXS voltage of VXP).

For the memory sector 20 having the sub-sector of memory to be erased, the LX_H and LY_H page-row information are at logic level "1," LS_H is also at logic level "1," and PD_H, PDP_H and P_H may be either at logic levels "0" or "1" depending on which of the sub-sectors are selected for the erase operation. For example, for the sub-sectors that are not selected to be erased, at least one of PD_H or PDP_H is a logic level "0." As a result, for the unselected sub-sectors the decode selection signals DECS_S are at logic level "1" and SP are at logic level "1." The voltage levels for the "1" and "0" logic levels are set by VXS and DECS_SECT voltages, respectively. During an erase operation, the VXS voltage is GND and the DECS_SECT voltage is HVNEG for the memory sector having the sub-sector to be erased. Thus, for the unselected sub-sectors in the same memory sector 20 as the sub-sector to be erased both decodes selections signals DECS_S and SP are at GND. As previously discussed, the switches 358 are controlled by the switch control signals GPN provided by the multiplexer control logic 354. The logic levels of the GPN signals are controlled in part by the P page-row information (recall that LS_H is at logic level "1" for the entire memory sector having the selected sub-sector to be erased). However, given that both decode selection signals DECS_S and SP are at GND, the P information for the unselected sub-sectors of memory may be inconsequential.

For the selected sub-sector of memory to be erased, the PD_H and PDP_H information are at logic level "1" (along with LX_H and LY_H at logic level "1" and LS_H at logic level "1"). As a result, the decode selection signals DECS_S are at logic level "0" and SP are at logic level "1." As previously described, the voltage levels for the "1" and "0" logic levels are set by VXS and DECS_SECT voltages, respectively, for the memory sector having the selected sub-sector of memory to be erased. As further previously described, during the erase operation, the VXS voltage is GND and the DECS_SECT voltage is HVNEG for the memory sector having the sub-sector to be erased. The P information, may be used to select word lines WL of the selected sub-sector to be erased. For example, a particular word line or word lines are selected by the corresponding P information, having a "1" logic level. For the word lines WL that are not programmed in the selected sub-sector the P information has a "1" logic level. That is, the switches 358 that are coupled to the logic circuits 360 that receive P information having a "0" logic level couple the respective WL to DECS_S (i.e., HVNEG) for erasing. In contrast, the remaining switches 358 are controlled by the logic circuits 360 receiving P information having a logic level "0" to couple the respective WL to SP (i.e., GND). Note that although the switches 358 of the sub-sectors that are not selected to be erased may couple the respective WLs to either SP or DECS_S based on the P information, as previously discussed the SP and DECS_S voltages for those unselected sub-sectors are both at VXS (i.e., GND).

As illustrated by the previous example, the page-sector row selector 300 provides negative voltage selection of the WLs or particular WLs belonging to one (or more) sub-sectors of memory. Additionally, the unselected WLs of the unselected sub-sectors of the same memory sector are coupled to GND and the WLs of the unselected memory sectors are coupled to a high positive voltage VXP. The erase operation also does not exceed the voltage operating limit of the transistors. For example, as described to the previous example operation no transistor gate is connected simultaneously to both VXP and VNEG.

In general terms, the selected and unselected sectors of memory are configured during erase operations by managing the voltage supply connections. The erase selection "pattern" for selecting a WL or WLs to be erased is propagated to the selected sub-sector of memory using the appropriate voltage levels for the erase operation. The word line selection pattern applied to the sector of memory having memory to be erased addresses a specific subset of word lines to be erased. The WLs associated with the SP and DECS_S pair is used to provide the first and second logic level voltages for a selected memory sub-sector. As also illustrated by the previous example, the sub-sector-erase-pattern is carried by the PD_H and PDP_H busses while the individual WL erase pattern is set adding a "reverse" pattern on the P_H bus.

Managing voltage levels and logic voltage levels as previously described allow propagation of the erase-selection pattern for a selected memory sub-sector using a sector selection information (i.e., LS) having the "canonical" logic "1" for the selected sector of memory and "0" for the non-selected sectors of memory. Additionally, the busses for the pre-decoded address information are shifted to the same voltage level and logic voltage levels as used in the selected sector of memory.

A possible switching sequence to access the erase phase may be possible during "non stressing" auxiliary phases, where the VXF and VNEG voltages are set to relatively "mild" V+ & V− values, and the decoding gates can still work as a logic, for example, VXS=VXP and DECS_SECT=VNEG in all the sectors of memory. The non-erase signal (ER/) is put to a "0" logic level and the pre-decoded buses set to the erase configuration, as previously described. As a result the WL selection pattern is propagated in the selected sector of memory while in the non-selected sectors of memory the LS_S and LS pre-decoded address information having a "0" logic level creates a "bulk 0" on the SP and GPN lines and a "bulk 1" on the DECS_S lines. The related WLs are therefore set to a "bulk 1," which may be held during the erase phase by the SP and GPN paths. During the erase phase (when the voltage level are set as shown in FIG. 4), the SP, GPN and DECS_S lines may reverse their configuration, that is, apply "bulk 1" on the SP and GPN lines and "bulk 0" on the DECS_S lines.

Although the operation of the page-sector row selector 300 was described with reference to a page memory, the page-sector row selector 300 may be used with a non-page memory as well. Those ordinarily skilled in the art will have sufficient understanding based on the description provided herein to make modifications as necessary for use with non-page memories.

Figure 5A:
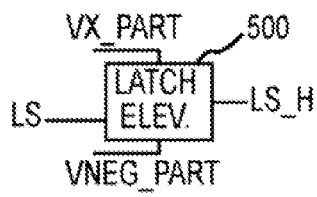
FIGS. 5A through 5F are block diagrams of various logic circuits and latch and voltage shift circuits according to embodiments of the invention.

FIG. 5A illustrates a latch and voltage shirt circuit 500 according to an embodiment of the invention. The latch and voltage shift circuit 500 may be used for the voltage shift circuit 302 of the embodiment of the page-sector row selector 300 of FIG. 3. In operation, the latch, and voltage shift circuit 500 provides pre-decoded information LS_H having voltage levels set by a VX_PART voltage and a VNEG_PART voltage (e.g., a "1" logic level has the VX_PART voltage and a "0" logic level has the VNEG_PART voltage) responsive to the pre-decoded information LS. The VX_PART and VNEG_PART voltages may be system supply voltages generally provided to the circuitry of the system for operation. As previously discussed, the LS pre-decoded information may have relatively low voltage levels and the LS_H pre-decoded information may have relatively high voltage levels for use in the page-sector row selector 300, for example. In some embodiments, the latch and voltage shift circuit 200 of FIG. 2 may be used as the latch and voltage shift circuit 500.

Figure 5B:
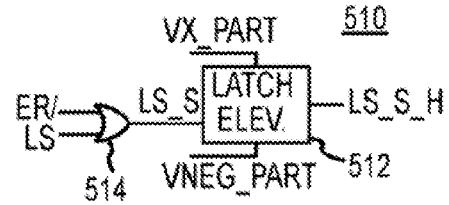

FIG. 5B illustrates logic-latch and voltage shift circuit 510 according to an embodiment of the invention. The logic-latch and voltage shift circuit 510 may be used for the logic-latch and voltage shift circuit 304 of the embodiment of the page-sector row selector 300 of FIG. 3. The logic-latch and voltage shift circuit 510 includes logic 514 and a latch and voltage shift circuit 512. The logic 514 may be an OR logic gate, as illustrated in FIG. 5B. The logic 514 provides pre-decoded information LS_S based on the logic levels of the LS pre-decoded information and an erase enable signal ER. In the embodiment illustrated in FIG. 5B, the ER signal is an active low signal, designated as ER/, which when active enables erase operations for the page-sector row selector 300, for example, while forcing LS_S_H to be "1" during all operations other than erase. This, together with a "bulk 1" forcing of PD and PDP lines, may provide for the DECS_S to be forced to "0" in the non-erase operation. The latch and voltage shift circuit 512 provides pre-decoded information LS_S_H responsive to the LS_S information. The LS_S_H information has voltage levels set by a VX_PART voltage and a VNEG_PART voltage (e.g., a "1" logic level has the VX_PART voltage and a "0" logic level has the VNEG_PART voltage). The LS_S_H pre-decoded information may have relatively high voltage levels for use in the page-sector row selector 300, for example.

Figure 5C:
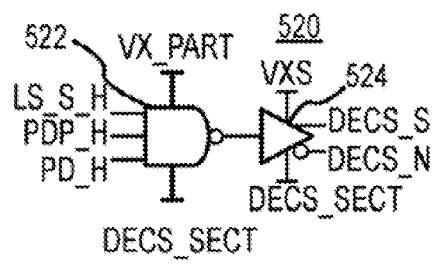

FIG. 5C illustrates logic circuit 520 according to an embodiment of the invention. The logic circuit 520 may be used for the logic circuits 312 of the embodiment of the page-sector row selector 300 of FIG. 3. The logic circuit 520 includes logic 522 and a driver 524. The pre-decoded information LS_S_H, PDP_H, and PD_H are provided to the logic 522, which is configured to provide an output based on the logic levels of the LS_S_H, PDP_H, and PD_H information. The output has voltage levels set by a VX_PART voltage and a DECS_SECT voltage (e.g., a logic "1" has a VX_PART voltage level and a logic "0" has a DECS_SECT voltage). The logic 522 is illustrated as a NAND gate for the embodiment of FIG. 5C, but other logic functions may be used as needed. The VX_PART voltage, as previously discussed, may be a system supply voltage generally provided to the circuitry of the system for operation. The DECS_SECT voltage may be a local supply voltage provided to the circuitry of a page-sector row selector, for example, for operation. The output of the logic 522 is provided to the driver 524, which provides decode selection signals DECS_S and its logical complement DECS_N. The voltages of the DECS_S and DECS_N decode selection, signals are set by voltages VXS and DECS_SECT. The VXS voltage may be a local supply voltage provided to the circuitry of a page-sector row selector, as the DECS_SECT voltage.

Figure 5D:
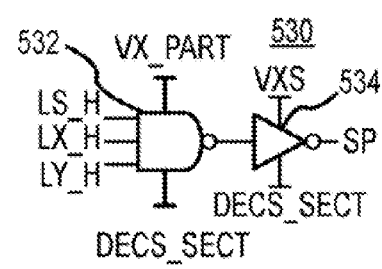

FIG. 5D illustrates a logic circuit 530 according to an embodiment of the invention. The logic circuit 530 may be used for the logic circuits 322 of the embodiment of the page-sector row selector 300 of FIG. 3. The logic circuit 530 includes logic 532 and an inverter 534. The pre-decoded information LS_H, LX_H, and LY_H are provided to the logic 532, which is configured to provide an output based on the logic levels of the LS_H, LX_H, and LY_H information. The output has voltage levels set by a VX_PART voltage and a DECS_SECT voltage (e.g., a logic "1" has a VX_PART voltage level and a logic "0" has a DECS_SECT voltage). The logic 532 is illustrated as a NAND gate for the embodiment of FIG. 5D, but other logic functions may be used as needed. The output of the logic 532 is provided to the inverter 534, which provides decode selection signals SP. The SP decode selection signal has a logic level that is the complement of the output from the logic 532. The voltages of the SP decode selection signal is set by voltages VXS and DECS_SECT.

Figure 5E:
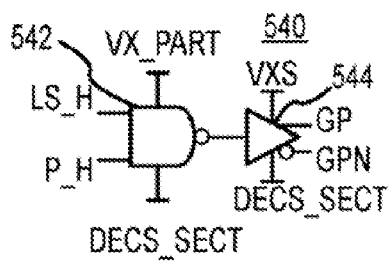

FIG. 5E illustrates a logic circuit 540 according to an embodiment of the invention. The logic circuit 540 may be used for the logic circuits 360 of the embodiment of the page-sector row selector 300 of FIG. 3. The logic circuit 540 includes logic 542 and a driver 544. The pre-decoded information LS_H and P_H are provided to the logic 542, which is configured to provide an output based on the logic levels of the LS_H and P_H information. The output has voltage levels set by a VX_PART voltage and a DECS_SECT voltage (e.g., a logic "1" has a VX_PART voltage level and a logic "0" has a DECS_SECT voltage). The logic 542 is illustrated as a NAND gate for the embodiment of FIG. 5E, but other logic functions may be used as needed. The output of the logic 542 is provided to the driver 524, which provides switch control signals CP and its logical complement GPN. The voltages of the GP and GPN switch control signals are set by voltages VXS and DECS_SECT.

Figure 5F:
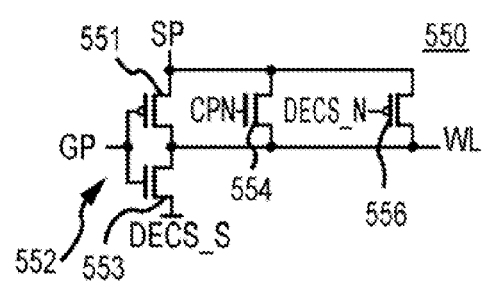

FIG. 5F illustrates a word line selection circuit 550 according to an embodiment of the invention. The word line selection circuit 550 may be used for the word line selection circuits 358 of the embodiment of the page-sector row selector 300 of FIG. 3. The word line selection circuit 550 includes complementary-FET inverter 552 and transistors 554 and 556 coupled to a respective word line WL. The word line WL is coupled to the voltage of the SP decode selection signal responsive to the PFET of the inverter 552 or the transistors 554 or 556 being activated to be conductive. As known, the PFET and transistor 556 are conductive responsive to the voltages of the GP switch control signal or the DECS_N decode selection signal being at logic level "0" (while the SP line is at logic level "1"). The transistor 554 is conductive responsive to the voltage of the GPN switch control signal being at logic level "1" (while the DECS_S logic level is at "0"). As previously discussed, the VXS and DECS_SECT voltages, which set the voltage of the GP, GPN, and SP signals may change according to the operation performed, for example, read memory, program memory, or erase memory.

FIGS. 5A-5F illustrate embodiments of circuitry that may be used to provide the voltages during an erase operation as described with reference to FIG. 4. As a result, the circuitry may provide during an erase operation (1) propagation of the sub-sector or signal WL selection pattern in the selected sector of memory and (2) force an "all 1" pattern to the WLs in the unselected sectors of memory (forcing to "1" the LS and GPN lines).

Figure 6:
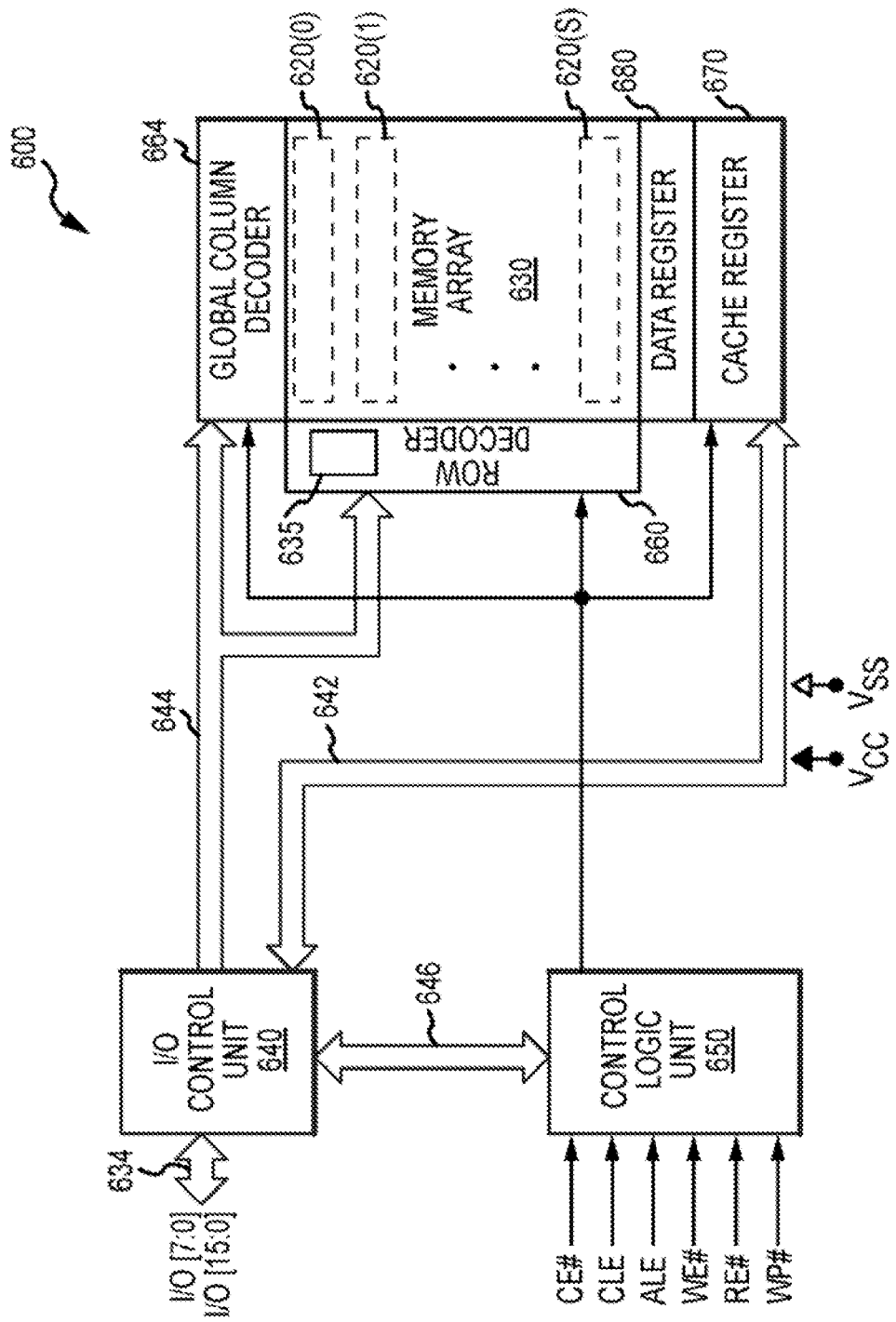
FIG. 6 is a block diagram of a memory including a decoding block according to an embodiment of the invention.

A flash memory 600 that includes the decoding block according to an embodiment of the invention is shown in FIG. 6. The flash memory 600 includes an array 630 of flash memory. The memory may be arranged m sectors of memory 620(0)-620(S) that are independently accessible for memory operations. The sectors of memory 620(0)-620(S) may be arranged in memory sub-sectors (not shown). Most command signals, the address signals and the write data signals are applied to the memory 600 as sets of sequential input/output ("I/O") signals transmitted through an I/O bus 634. Similarly, read data signals are output from the flash memory 600 through the I/O bus 634. The I/O bus is connected to an I/O control unit 640 that routes the signals between the I/O bus 634 and an internal data bus 642, an internal address bus 644, and an internal command bus 646. The flash memory 600 also includes a control logic unit 650 that receives a number of control signals either externally or through the command bus 646 to control the operation of the memory 600.

The address bus 644 applies row address signals to a row decoder 660 and column address signals to a global column decoder 664 and local column decoders (not shown). A portion of the column address signals are provided to the global column decoder 664 and another portion are provided to the local column decoders. The row decoder 660, column decoder 664 and local column decoders may be used to select sectors of memory, memory sub-sectors, or memory cells tor memory operations. The row decoder 660 may be sectorized, as shown in FIG. 1, and a portion of the row address (e.g., sector information LS) may be used to access a sector of memory. A further portion of the row address may be used to access a sub-sector and the remaining portion used to select individual rows (i.e., word lines) of memory. Global and local column addresses may be used to access individual memory cells in the selected row, with the local column decoder activated in the selected sector. The row decoder 660 includes a decoding block 635 according to an embodiment of the invention to decode pre-decoded address information for performing memory operations, for example, erase, program, and read, on memory corresponding to the pre-decoded address information. The column decoder 664 enables write data signals to be applied to bit lines for columns corresponding to the column address signals and allow read data signals to be coupled from bit lines for columns corresponding to the column address signals.

In response to the memory commands decoded by the control logic unit 650, the flash memory in the array 630 are erased, programmed, or read. The memory array 630 is programmed on a row-by-row or page-by-page basis. After the row address signals have been applied to the address bus 644, the I/O control unit 640 routes write data signals to a cache register 670. The write data signals are stored in the cache register 670 in successive sets each having a size corresponding to the width of the I/O bus 634. The cache register 670 sequentially stores the sets of write data signals for an entire row or page of flash memory ceils in the array 630. All of the stored write data signals are then used to program a row or page of memory cells in the array 630 selected by the row address coupled through the address bus 644. In a similar manner, during a read operation, data signals from a row or page of memory cells selected by the row address coupled through the address bus 644 are stored in a data register 680. Sets of data signals corresponding in size to the width of the I/O bus 634 are then sequentially transferred through the I/O control unit 640 from the data register 680 to the I/O bus 634.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An address decoder, comprising:
a latch and voltage shift circuit including a first stage configured to receive address information at first voltage levels and provide a first stage output at intermediate voltage levels and including a second stage configured to receive the first stage output and shift the intermediate voltage levels of the same to second voltage levels to provide a second stage output, the address decoder configured to decode the second stage output at each of a plurality of sector decoders to select one or more control gates, wherein each of the plurality of sector decoders include a plurality of first logic gates configured to each receive first portions of the second stage output and a plurality of second logic gates configured to each receive second portions of the second stage output, and a multiplexer configured to select between outputs of the plurality of first logic gates and outputs of the plurality of second logic gates based on third portions of the second stage output to provide respective control signals to the select one or more control gates.

2. The address decoder of claim 1, wherein the address decoder is configured to select control gates based on the address information using one or more page sector decoders.

3. The address decoder of claim 1, wherein the address information includes page-row information, memory sector information, or a combination thereof.

4. The address decoder of claim 1, wherein the first stage includes a plurality of complementary-FET inverters.

5. The address decoder of claim 1, wherein a voltage level of the intermediate voltage levels is the same as a voltage level of the second voltage levels.

6. The address decoder of claim 1, wherein the first stage is configured to provide the first stage output during a first phase and the second stage is configured to shift the intermediate voltage of the first stage output to the second voltage levels during a second phase.

7. The address decoder of claim 6, wherein the first phase is a data load phase and the second phase is a data latch phase.

8. An apparatus, comprising:
an address decoder configured to receive an input signal having one of a first plurality of voltage levels and to provide an intermediate signal based, at least in part, on the input signal, the intermediate signal having one of a second plurality of voltage levels, the address decoder further configured to provide a first output signal having a first one of a third plurality of voltage levels and to provide a second output signal having a second one of the third plurality of voltage levels, the first and second output signals based, at least in part, on the intermediate signal,
wherein the address decoder is further configured to decode the first and second output signals to select one or more control gates and wherein the address decoder includes a plurality of logic gates, each of which are configured to receive portions of the second output signals and provide respective control signals, and wherein a multiplexer couples one or more respective control signals to the select one or more control gates based at least on part on a portion of the first and second outputs decoded by multiplexer control logic.

9. The apparatus of claim 8, wherein the first and second output signals are complementary.

10. The apparatus of claim 8, wherein at least one voltage level of the second plurality of voltage levels is the same as a voltage level of the third plurality of voltage levels.

11. The apparatus of claim 8, wherein the address decoder is configured to provide the intermediate signal using a first stage and to provide the first and second output signals using a second stage.

12. The apparatus of claim 8, wherein the address decoder is further configured to select a portion of memory based, at least in part, on the first and second output signals.

13. The apparatus of claim 8, wherein each of the third plurality of voltage levels is a supply voltage.

14. The apparatus of claim 8, wherein at least one of the second plurality of voltage levels is based on an operation of a memory.

15. A method for decoding pre-decoded address information, comprising:
receiving, at a first stage of an address decoder, address information having first voltage levels;
providing a first stage output at intermediate voltage levels based on the address information;
receiving, at a second stage of the address decoder, the first stage output;
shifting the voltage levels of the first stage output to second voltage levels to provide a second stage output;
decoding, by a first logic gate, a first subset of the second stage output;
decoding, by a second logic gate, a second subset of the second stage output;
decoding, by a third logic gate, a third subset of the second stage output;
selecting the output of either the first or second logic gates based on the decoding of the third subset of the second stage output; and
providing the selected output of either the first or second logic gates to at least one control gate of a plurality of control gates.

16. The method of claim 15, further comprising:
performing an erase operation on a wordline of a cell array via the control gate of the plurality of control gates.

17. The method of claim 15, wherein providing a first stage output at intermediate voltage levels based on the address information comprises:
providing an output having a reference potential.

18. The method of claim 15, wherein shifting the voltage levels of the first stage output to second voltage levels comprises:
increasing a magnitude of the voltage levels of the first stage output.

19. The method of claim 15, wherein shifting the voltage levels of the first stage output to second voltage levels comprises:
shifting the voltage levels of the first stage output based on an operation of a memory.

20. The method of claim 15, wherein shifting the voltage levels of the first stage output to second voltage levels comprises:
shifting the voltage levels of the first stage output to supply voltages.

* * * * *